United States Patent [19]
Schwob

[11] Patent Number: 4,969,209
[45] Date of Patent: Nov. 6, 1990

[54] BROADCAST RECEIVER CAPABLE OF SELECTING STATIONS BASED UPON GEOGRAPHICAL LOCATION AND PROGRAM FORMAT

[75] Inventor: Pierre R. Schwob, New York, N.Y.

[73] Assignee: PRS Corporation, New York, N.Y.

[21] Appl. No.: 212,863

[22] Filed: Jun. 29, 1988

Related U.S. Application Data

[63] Continuation-in-part of Ser. No. 78,286, Jul. 27, 1987.

[51] Int. Cl.$^5$ .............................................. H04B 11/16
[52] U.S. Cl. ................................... 455/158; 455/161; 455/186
[58] Field of Search ............... 455/158, 161, 184, 186, 455/157, 52, 156, 154, 166

[56] References Cited

U.S. PATENT DOCUMENTS

| | | | |
|---|---|---|---|
| 4,081,753 | 3/1978 | Miller | 325/396 |
| 4,253,194 | 2/1981 | Van Deursen | 455/161 |
| 4,268,915 | 5/1981 | Parmet et al. | 455/158 |
| 4,320,255 | 3/1982 | Null et al. | 179/1 G |
| 4,392,246 | 7/1983 | Nioka et al. | 455/158 |
| 4,410,913 | 10/1983 | Chin et al. | 358/192.1 |
| 4,521,914 | 6/1985 | Petrovic | 455/186 |
| 4,682,370 | 7/1987 | Matthews | 455/166 |

FOREIGN PATENT DOCUMENTS

| | | |
|---|---|---|
| 3007523 | 9/1981 | Fed. Rep. of Germany . |
| 3031527 | 2/1982 | Fed. Rep. of Germany . |
| 3104845 | 8/1982 | Fed. Rep. of Germany . |
| 3504066 | 8/1986 | Fed. Rep. of Germany . |
| 2287825 | 5/1976 | France . |
| 55-96733 | 7/1980 | Japan . |
| 59-24953 | 3/1985 | Japan ................................ 455/154 |
| 60-93828 | 5/1985 | Japan ................................ 455/154 |
| 61-32613 | 2/1986 | Japan . |

*Primary Examiner*—Reinhard J. Eisenzopf
*Assistant Examiner*—Curtis Kuntz

[57] ABSTRACT

A broadcast receiver is capable of selecting a broadcast station based upon a user selected program format and the geographical location of the receiver. The receiver includes a memory storing a database of information relating to frequencies of broadcast stations broadcasting into particular geographical locations and the program format of each such broadcast frequency. After a user inputs the geographical location of the receiver and a desired program format, the database may be scanned to select a broadcast frequency corresponding to the input geographical location and program format for retrieval. This selected frequency is used to tune the receiver. The geographical location, identification information, and program format for the selected frequency are then visually displayed.

10 Claims, 8 Drawing Sheets

FIG-2

Database Organization

Format Scan

BROADCAST RECEIVER CAPABLE OF SELECTING STATIONS BASED UPON GEOGRAPHICAL LOCATION AND PROGRAM FORMAT

This application is a continuation-in-part of my co-pending application Ser. No. 078,286 for DISPLAY FOR RADIO RECEIVER filed July 27, 1987, still pending.

This invention relates generally to improvements in receivers. More specifically, it relates to improvements in means for conveying information to the users of such receivers and in means for receiving stations of a preselected type.

BACKGROUND OF THE INVENTION

There are, of course, numerous devices for conveying, particularly with displays, information to the users of broadcast receivers, particularly, home and auto radio receivers. Such displays have taken the form of using 7-segment gas diodes, light emitting diodes and even liquid crystal display panels to provide the user information about the frequency of the station to which he is listening. An example of a liquid crystal display is shown in the U.S. Pat. to Schiebelhuth No. 4,040,719. Another such patent is the U.S. Pat. to Oshawa No. 4,123,714. In this patent, the liquid crystal display merely advises the user whether the broadcast is stereo or monaural. Still another patent concerned with displaying the broadcast frequency to the user is the U.S. Pat. to Froeliger No. 4,495,651.

A conventional scanning receiver is one which can be operated to scan over a portion of the broadcast frequency spectrum to stop at a received station having a sufficient signal strength and permit a user to listen to or watch that station. Such receivers for instance, are often provided in vehicles and operated to scan either AM or FM bands to stop at the first station received for a period of time to permit the user to decide if the station received is one he wants to listen to or to let the scanning operation resume.

The usefulness and attractiveness of receivers can be enhanced considerably by the provision of a receiver capable of conveying greater amounts of information to the user. Likewise, by the provision of a preprogramming capability, the foregoing and other advantages to the user can be had.

Therefore, it is an object of this invention to provide a novel receiver capable of conveying a large amount of information to the user.

It is another object of this invention to provide a novel receiver capable of being programmed by the user while at the same time displaying information about the program or other data entered into a memory.

It is another object of this invention to provide a novel broadcast receiver capable of scanning a broadcast band based on a selective fashion to receive a station broadcasting in a format desired by a user.

It is a further object to this invention to provide a novel broadcast receiver capable of providing a user with information about varying broadcast formats which might be available and permitting the user to select the format the wishes to receive and then to scan a broadcast band until that format is received.

A still further object to this invention is to provide a novel broadcast receiver having data pre-stored in a memory means representing a plurality of identifying attributes of a number of broadcast stations, is for instance throughout the U.S., and cooperating with computer means to permit a user to cause the receiver to scan a broadcast band until a station with one of those identifying attributes selected by the user, format for instance is received.

Another object of this invention is to provide a novel broadcast receiver having a means of communicating to a user various types of broadcasting formats so that the user can select the format he wishes to receive and cause the receiver to scan scan a selected broadcast band until the selected format is received, if it is available within the range of the receiver.

BRIEF SUMMARY OF THE INVENTION

The objects of this invention are achieved by a receiver utilizing one or more CPUs or microprocessors provided with memory capabilities together with means to drive a display and provide I/O ports in combination with an input keyboard. The CPUs or microprocessors are programmed to permit reception of stations having preselected attributes such as a particular program format.

DESCRIPTION OF THE DRAWINGS

The invention itself is set forth in the claims appended hereto and form a part of this specification, while an understanding of an embodiment thereof may be had by reference to the detailed description taken in conjunction with the drawings in which:

FIG. 2 is an illustration of an embodiment of the front of a receiver which can be used to practice the invention;

DETAILED DESCRIPTION

Figure 1:
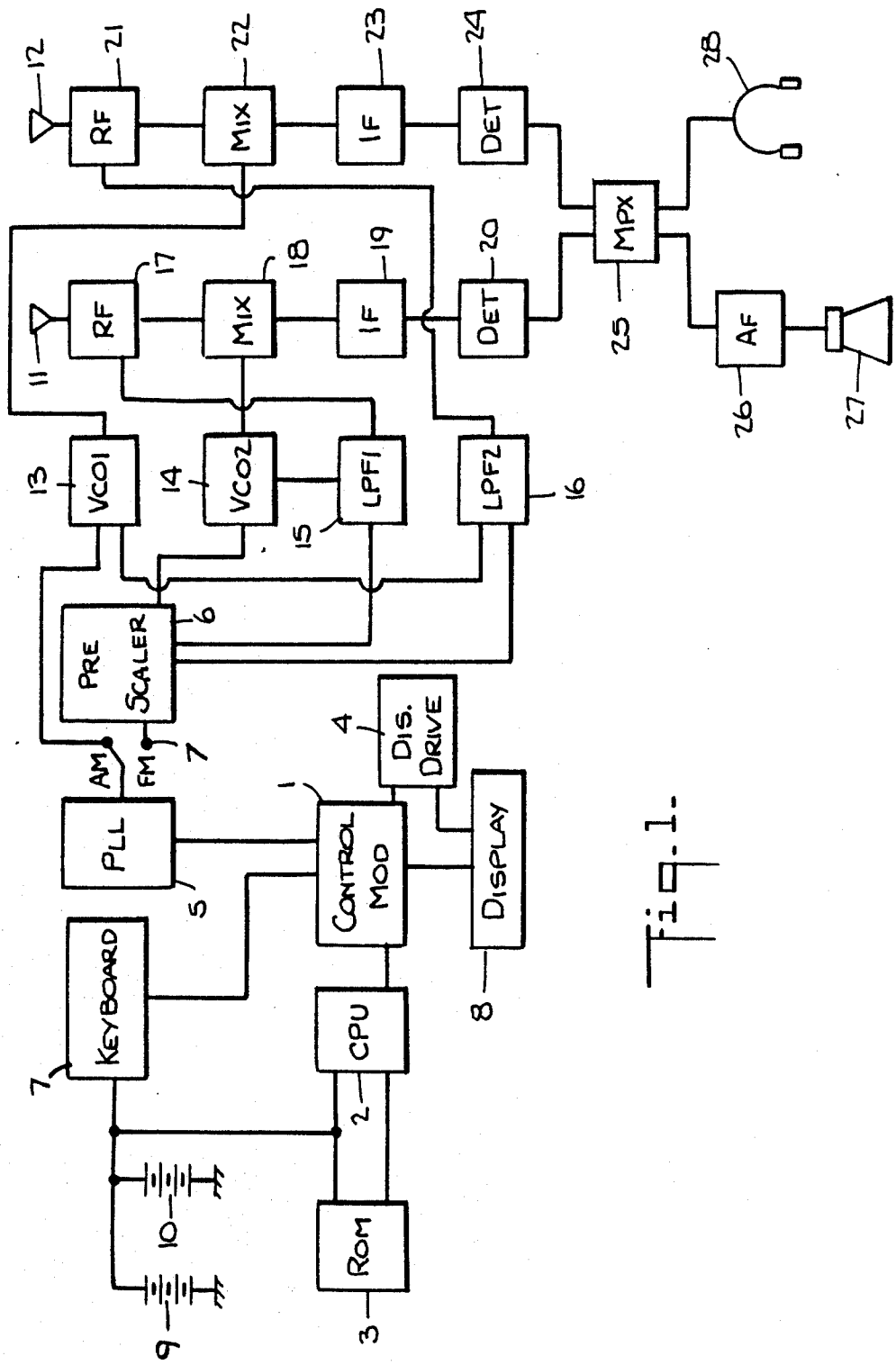
FIG. 1 is a block diagram illustrating a radio receiver in accordance with the invention.

Referring first to FIG. 1 of the drawings a radio receiver in accordance with the invention includes a control module 1. In this embodiment, the control module is constituted by a one-chip CPU such as the T-18 manufactured by Toshiba and is described in the published technical data for this chip. It includes as a program memory a ROM, a RAM data memory together with a liquid crystal display driver circuit, input/output ports and timing oscillators. As will be described hereinafter various inputs are provided for the T-18 chip.

The receiver itself includes the usual radio frequency and audio frequency circuits for both AM and FM. The FM circuit includes an antenna 11 for connection to a RF radio frequency section 17 the output of which in turn is connected to a mixer 18. The output of the mixer is supplied to an intermediate frequency amplifier 19 and its output in turn is supplied to a detector 20. The output of the detector is coupled to a multiplexer 25 which feeds earphones 28 and an audio frequency amplifier 26 that supplies a speaker 27.

A similar circuit is provided for AM signals and is constituted by an antenna 12 for connection to a RF radio frequency section 21 the output of which in turn is connected to a mixer 22. The output of the mixer is supplied to an intermediate frequency amplifier 23 and its output in turn is supplied to a detector 24. As before, the output of the detector is coupled to the multiplexer 25 which feeds earphones 28 and an audio frequency amplifier 26 that supplies the speaker 27.

Tuning of the radio is accomplished through the provision of a phase-lock-loop (PLL) chip 5. The PLL receives input signals from the control module 1 which signals determine the frequency of the output of the chip 5. A phase-lock-loop chip suitable for this purpose is the Toshiba TC9125BP in conjunction with a prescaler 6 such as the Toshiba TD6129P chip for the purpose of dividing, when in the FM mode, the output of a voltage-controlled oscillator (VCO2) 14. A switch 29 is provided to switch the input of the chip 5 from the prescaler when FM is desired. Otherwise, chip 5 is connected directly to a voltage-controlled oscillator (VCO1) 13. The PLL chip 5 also supplies output voltage to the low pass filters (LPF1) 15 and (LPF2) 16 which feedback on the VCO1 13 or VCO2 14 to ensure that the mixers 18 or 22 continue to produce the desired intermediate frequency for the amplifiers 19 or 23. The low pass filters (LPF1) 15 and (LPF2) 16 also provide the tuning signal for the RF receivers 17 and 21.

In the operation of a digital tuning module (DTM), the control module 1 supplies signals indicating the lock frequency that is the frequency of the station desired and the mode selection, that is whether the signal desired is the AM signal or the FM signal. As will be explained hereinafter the control unit is programmed to wait there a predetermined period, for instance 100 MS, and if within that period it receives a signal back indicating that the desired radio frequency has been received, no further signal will be sent from the control unit and the radio will operate to permit the reception of that signal. If within that period, no acknowledgment is received by the control unit, the program will direct that the control unit step to the next frequency and try again to determine if a signal is being received. The receiver shown and described is intended as an example that can be used in accordance with the invention and other forms of receivers can be used. For instance, it would be possible to utilize a receiver wherein a digital output of the control module 1 can be utilized in a digital to analog circuit controlling the frequency of local oscillators for the FM and AM circuits for tuning purposes.

In accordance with the invention, a read-only-memory (ROM) 3 is included in order to store information intended to be displayed. This information includes the identification of the various broadcasting stations, for instance in the case of U.S. stations: the frequency of each, the station call letters; the location, that is city and state; and even the format (type of programming). Thus the data stored in memory 3 can indicate on a display 8 whether a particular station in a particular city broadcasts, for example, classical music, country & western, jazz, or other format or type of programming. In the operation of the system, this memory would be addressed by a slave processor or CPU 2 so as to permit the visual display of data, such as that described, as the user tunes the radio or simply turns it on in order to receive a pre-selected station. A ROM 3 suitable for this purpose is the TC531000P chip from Toshiba which can store up to 128 kilobytes of data and which has the advantage of requiring a relatively low power for operation, thus permitting extended use of batteries. A slave processor suitable for this purpose is the MSM6404 chip available from Oki.

In order to display the desired information to the user and to permit programming of the radio, display 8 is provided and may be of the liquid crystal type. An additional driving element 4 may be provided to enhance the output capacity of the control module 1. An element suitable for this purpose is the T-7724 chip from Toshiba.

A keyboard 7 permitting the user to program the receiver is provided and constitutes an input to the control module 1.

Power can be supplied from battery sources 9 and 10 to produce the DC operating and backup voltages required. An optional AC to DC adapter can be provided to permit use without batteries.

Figure 2:
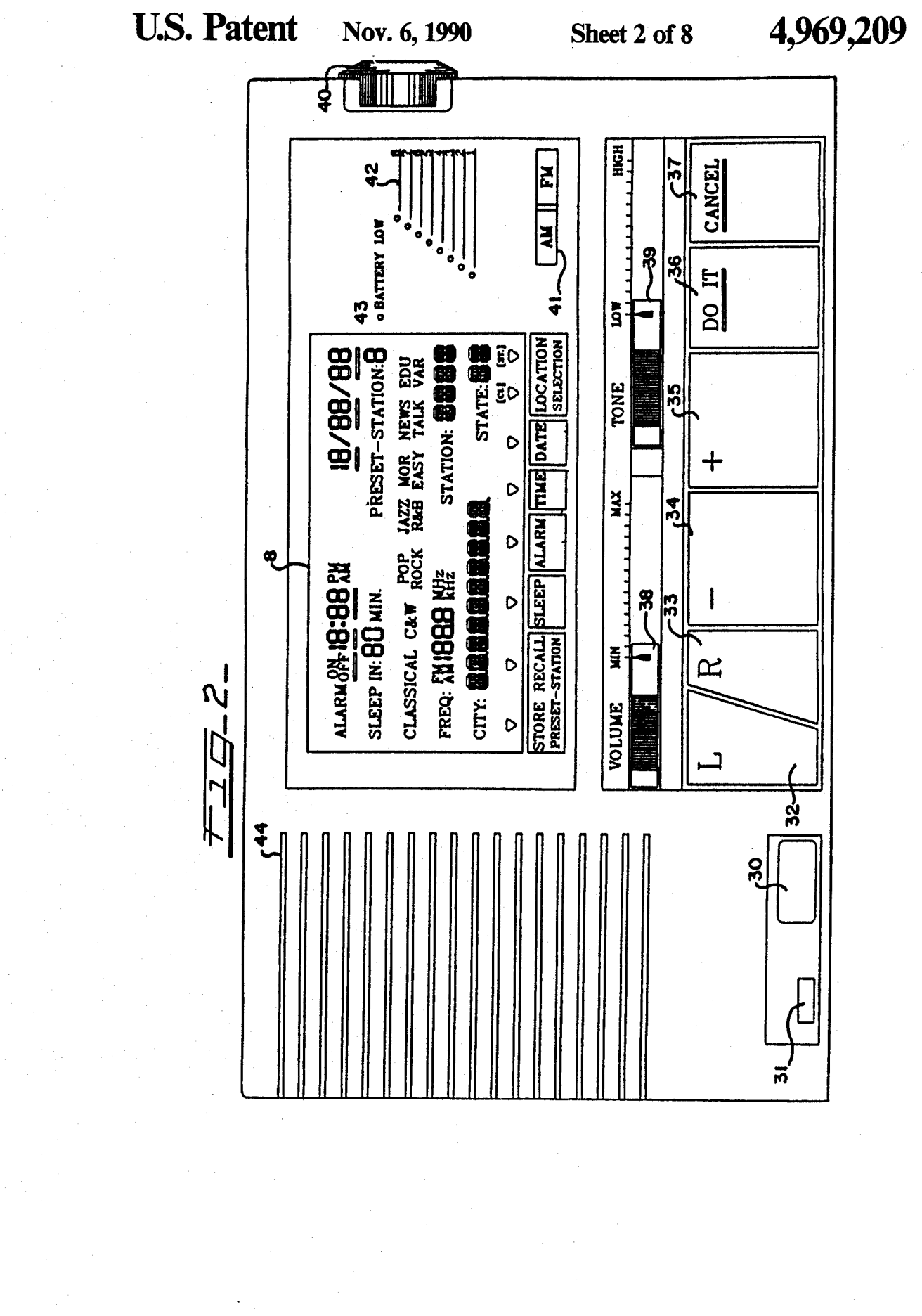
Figure 3:
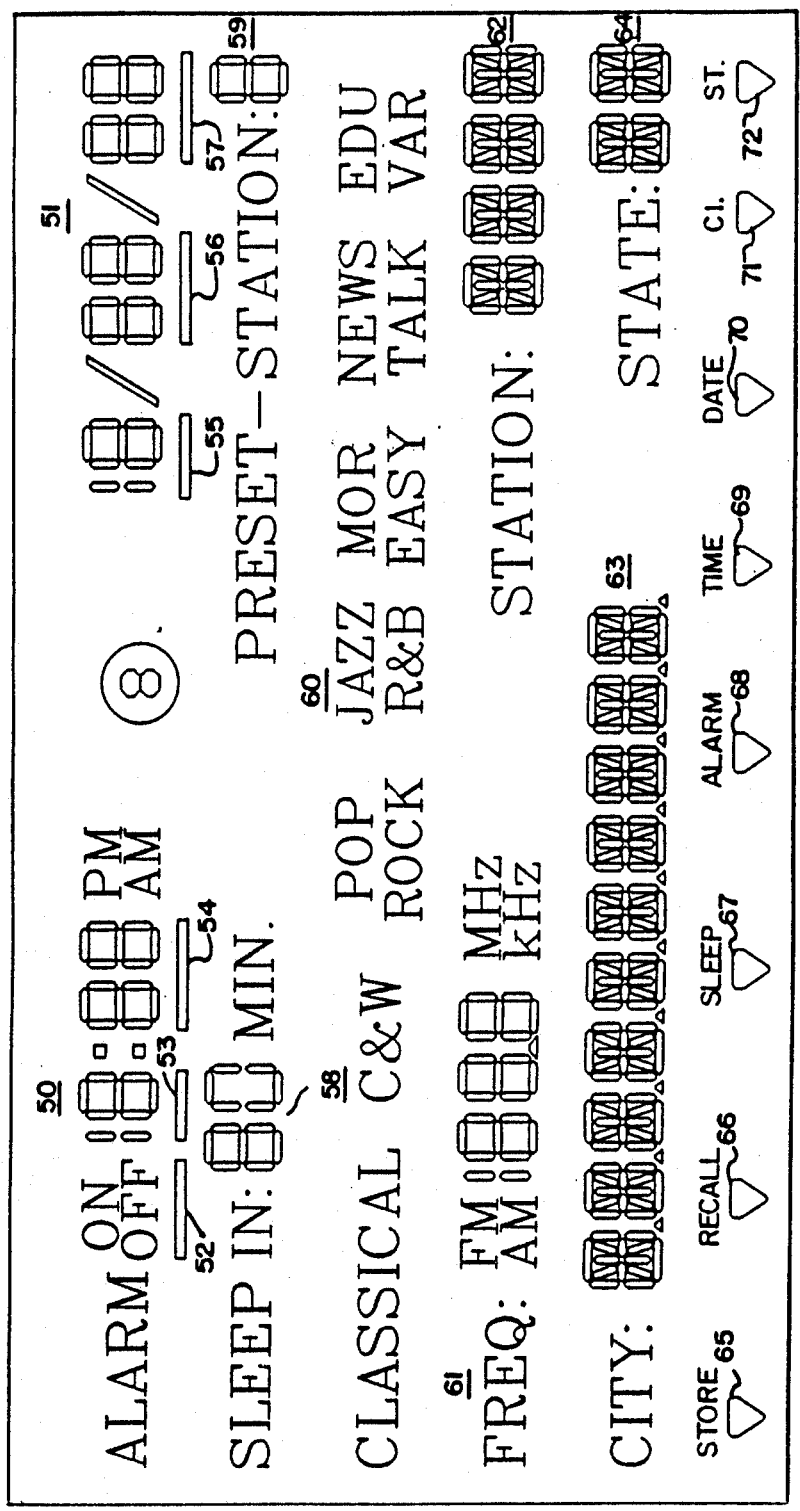
FIG. 3 is an illustration of an embodiment of the liquid crystal display which can be used to practice the invention.

An embodiment of the receiver in accordance with the invention is shown in FIG. 2. An embodiment of the display in accordance with the invention is shown in FIG. 3. Thus, such a receiver include the speaker 27 mounted behind outlet louvres 44. Digital signal strength meter 42 is shown and can consist of a number of LEDs provided with a scale to show signal strength. A tuning knob 40 may be placed on the side of the receiver. An on/off switch 30 together with a light 31 can be provided toward the bottom of the receiver. Volume control may be provided by the use of a sliding switch 38 cooperating with a scale while another sliding switch 39 is also provided with a scale for tone control.

The display 8, in addition to the information display capability that will be described, also includes a series of markers 65 to 72 and 52 to 57 (FIG. 3). These markers are used to permit programming of the receiver, whether it is to select the current time and the current date or the current location of the receiver or to preselect or tune to a radio station desired or to select an alarm or circuit to turn the receiver on or off at a predetermined time.

The markers are controlled by the keyboard 7. This keyboard comprises of a series of push buttons which may be of the diaphragm type and operates as follows: The switch 32 labeled L causes the markers to be sequentially enabled toward the left, that is from 72 towards 65 or 57 toward 52. The switch 33 labeled R causes the markers to be sequentially enabled toward the right. To enter a program of preselected stations or the time at which an alarm should be activated or any other bit of data, switches 34 and 35 are provided. The switch 34 with the minus sign causes a decrease of the values or alphabetical data chosen by the L or R switch each time it is operated. The switch 35 with the plus sign causes an increase of the values or alphabetical data chosen by the L or R switch each time it is operated. The switch 36 labeled "DO IT" will enter into the memory the information displayed and programmed by the use of the switches 32 to 35. Switch 37 labeled "CANCEL" is provided to cancel any unterminated action.

The display 8 in FIG. 3 of the illustrated embodiment can display information about the alarm 50, and whether it is on or off, the time for which the alarm is set, or the time of day and also the date 51. Also displayed is "SLEEP" information 58, that is the number of minutes the user may want the receiver to be operating before it turns itself off automatically. "Preset-Station" information 59 can be displayed to permit the user to store in or retrieve from memory the frequency of a station to which he wishes to listen to.

Also provided on the display are a series of indications 60 of the format (that is type of programming) conducted by the particular station being received. For example, such formats or types of programming may be classical music, country and western, pop, jazz, news, etc. This display is of particular value when the user is attempting to listen to stations that are unfamiliar to him.

Another section of the display 8 is an indication of the frequency of the station 61 being received, whether it is FM or AM, and whether the number displayed represents MHz or KHz. Also displayed are the call letters of the station 62, as is the city 63 and state 64 wherein the station is located. These city and state displays 63 and 64 are also used to select the location of the receiver.

These elements just described cooperate with the control module 1 and slave module 2 and the data stored in the ROM 3 to permit operation of the system. To achieve this end, a program is written for the control module 1 and the slave module 2 providing the basic control intelligence. Such programs can be written using well known computer languages and techniques and would include the capability of controlling and displaying the markers and alphanumerical displays in response to the actuation of the switches 32 to 37. The stored programs can also provide the required phase-lock frequency parameters to the PLL chip 5. Likewise the program will access the database stored in the ROM chip 3.

In the use of the receiver, after it has been turned on by the user and it is desired to select a station to be listen to, either the minus switch 34 or the plus switch 35 can be depressed or the dial 40 can be rotated causing the frequency to change either in the upward or downward direction. The program is such that if either switch 34 or 35 is depressed for a longer period than a predetermined period of time, the receiver will go into an automatic scanning mode. In such mode, upon receiving a signal of sufficient strength, the receive will stop the scan at that station and, if available, display the call letters of the station together with information about its geographic location and its broadcasting format. If this station is not what the user wishes, depressing either switch 34 or 35 will cause the receiver to scan for the next station When the user wishes to recall a station previously programmed, the left or right key 32 or 33 is used to move the marker to the position 66 and the plus or minus keys 34 or 35 are used to recall the chosen preset-station using the preset-station display 59, and again information about that station, that is, its frequency, call letters, etc. will be displayed. If the user wishes to go to another preset station, then either the plus or minus keys 34 or 35 are operated.

In order to program or preset a station, the user when listening to a particular station, the use will move the marker to the position 65 and by operating the plus or minus keys 34 or 35 and the preset-station display 59, determine the memory location in which he wishes to store the frequency of that station, that is, whether or not it is to be preset station number 1, 2 or some other number. The switch 36 labeled "DO IT" can then be operated to enter and store the frequency information with respect to that station in memory.

To operate in the sleep mode, the marker is moved to position 67 and the plus or minus keys are operated to show in the "SLEEP IN" display 58 the time period the user would like. The switch 36 is then operated to enter and start the time period.

The alarm is set by moving the marker to position 68. Underscores or markers 52 to 54 appear under the on-/off label or under each number position of the display 50 and the user can change the numbers again by the use of the keys 34 and 35 and again enter the desired time by operating switch 36.

The clock is set by moving the marker to position 69 and once again an underscoring 53 or 54 appears under a number position representing either the hours or minutes in the time display 50 which number can then be changed by operation of the keys 34, 35 and 36.

To set the date, the marker is moved to position 70 and again the keys 34, 35 and 36 are operated until the desired date appears in the date display 51.

The markers 71 and 72 are used to select a state and a city within that state when the receiver is moved to a different location, so that tuning or presetting within that new location may be accomplished as described above. In this case, the cities and states will be shown in alphabetical order in the displays 63 and 64 and the user can, by operating the keys 34 and 35, change the city and/or state displayed, thereby, permitting a new portion of the database in memory 3 to be activated.

Figure 4:
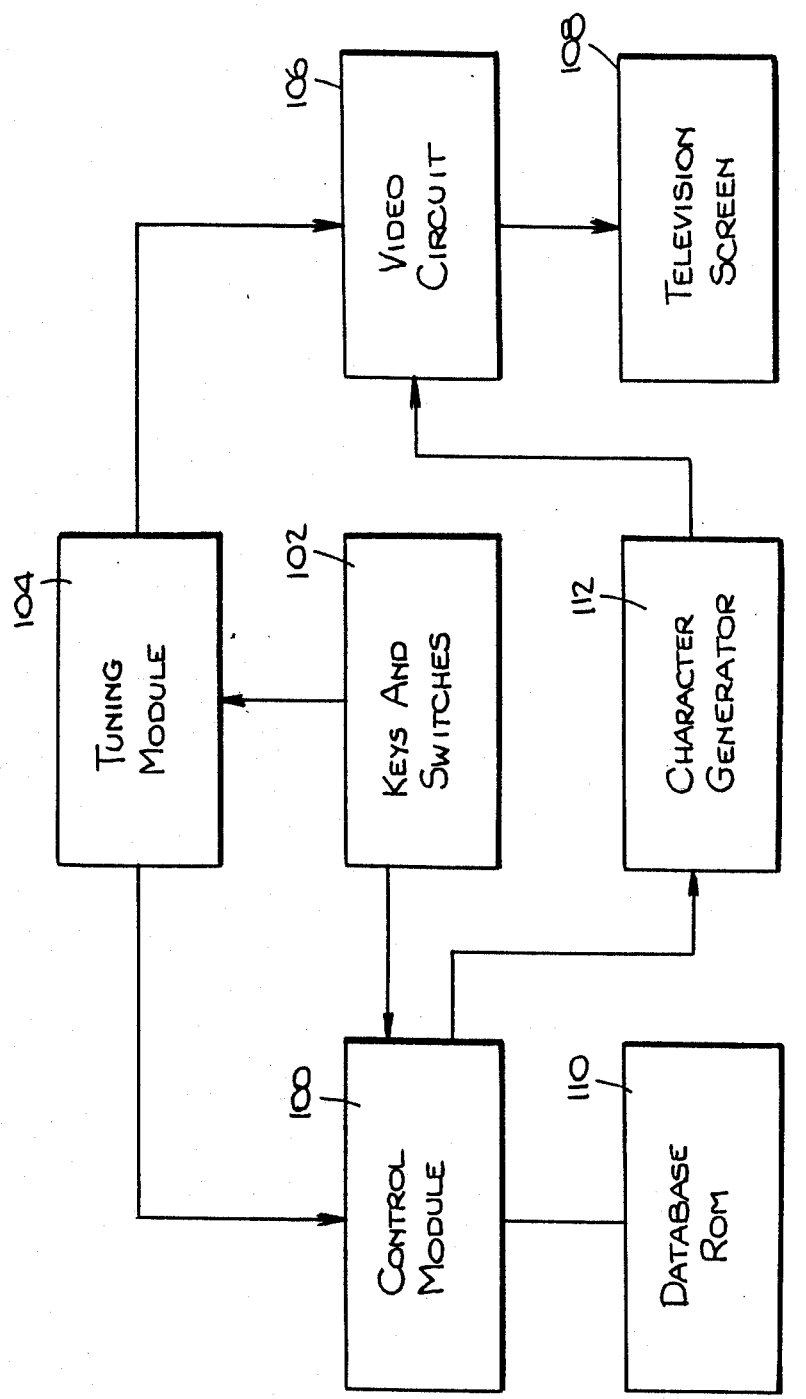
FIG. 4 is a block diagram illustration of an embodiment of the invention used in conjunction with a television receiver.

As may be seen in FIG. 4, the invention may be applied in a second embodiment for use in a television receiver. In this embodiment of the invention, a control module 100 receives inputs from keys and switches 102 as described above in connection with a receiver or tuning module 104 for selecting stations in a conventional video circuit that are, in turn, outputted to a television screen 108 in order to display the image being received. As before, database ROM 110 stores the information to be displayed about stations being received in this embodiment of the invention. The television screen 108 itself becomes the display and alpha-numeric characters are produced by a character generator 112 under the control of the control module and are supplied as input to the video circuit 106.

IMPROVED RECEIVER SYSTEM

As explained hereinbefore, broadcast stations have different formats. Thus, a given station, in the case of radio, will broadcast news, various types of music or be a "talk station". Listeners, of course, have equal numbers of varying tastes and more often than not want to tune to a station catering to their particular taste. This is almost certainly the case when the user is in a location where he or she is not familiar with the formats of the stations capable of being received.

The use of a database that is prestored in a ROM 3 as explained hereinbefore greatly increases the utility of the broadcast receiver for listeners who may find themselves in an unfamiliar locale. This utility can be enhanced by including in the control module 1 and slave module 2 program a broadcast program format scan or select capability. This permits the receiver to not only conventionally scan a broadcast band for any available signal, but more importantly to select stations having a particular program format. The prestored database therefore provides an accessible source of information for displaying certain attributes of a received station as explained hereinbefore, and furthermore is actively used to select only those radio stations having a desired listener format.

Figure 5:
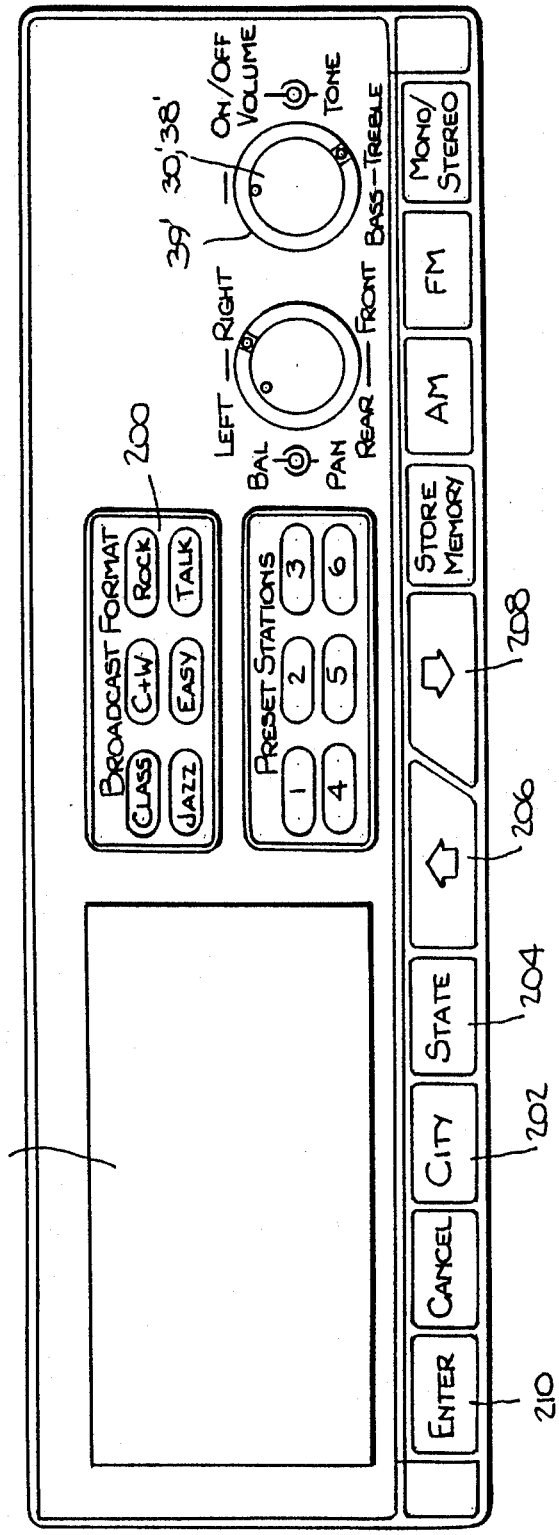
FIG. 5 is an illustration of an improved embodiment of the front of a receiver that can be used to practice the invention.

In accordance with this improvement, FIG. 5 illustrates the front of a receiver incorporating the improvement is a further embodiment of the present invention. Features which correspond substantially with the receiver illustrated in and explained with reference to FIGS. 2 and 3 are indicated by the same numeral with a prime (') suffix. Thus, knob 39, is used for manually setting the tonal balance (base/treble) of the received broadcast. Knobs 30'/38' provide a combined on/off switch with volume control.

A display 8' is provided which may conveniently convey the same type of information as the display shown in FIG. 3. However, the program format indicators (indicators 60 in FIG. 3) have been augmented with a set of matching pushbutton input switches or keys 200. There is one switch provided for each type of program format stored in the ROM 3. For example, in the current embodiment, the division of formats is made in six classes, each represented by a format-select key, which may be as follows:

CLASSICAL: Classical Music
C&W: Country & Western; Bluegrass; Folk Music
ROCK: Rock 'n' Roll; Disco; Top-40; Oldies; Adult Contemporary
JAZZ: Jazz; Rhythm & Blues; Reggae, Blues; Urban Contemporary
EASY: Easy Listening; Big Band; Beautiful Music; Middle-of-the-Road (M.0.R.)
TALK: News; Sports; Talk Shows; Comedy; Drama/Literature; Weather; Public Affairs.

Other format classifications could, of course, be used to suit different groups of users. In particular, the resolution of the format breakdown could be higher so that a more detailed format classification could be offered by increasing both the number of labeled format keys on the unit and the number of format-labels in the display. Each format switch 200 may be provided with individual lights in a known manner to indicate to the user when a particular switch is activated.

The receiver illustrated in FIG. 5 also includes city and state input switches 202, 204 which permit the user in combination with the up/down switches 206,208 to program into the control module 1 the geographic location of the broadcast receiver. As explained hereinbefore, this permits the control module 1 to access the correct portion of the database stored in ROM 3 that corresponds to the actual location of the receiver. The up/down switches 206,208 operate in a manner similar to the +/— switches 34,35 in FIG. 2 entering the city/state data and for tuning and scanning frequencies.

The internal configuration and operation of the receiver is substantially the same as explained with reference to FIG. 1, with the addition, of course that the keyboard input 7 now includes the individual format input and selection means buttons or keys 200 (FIG. 5).

Figure 6:
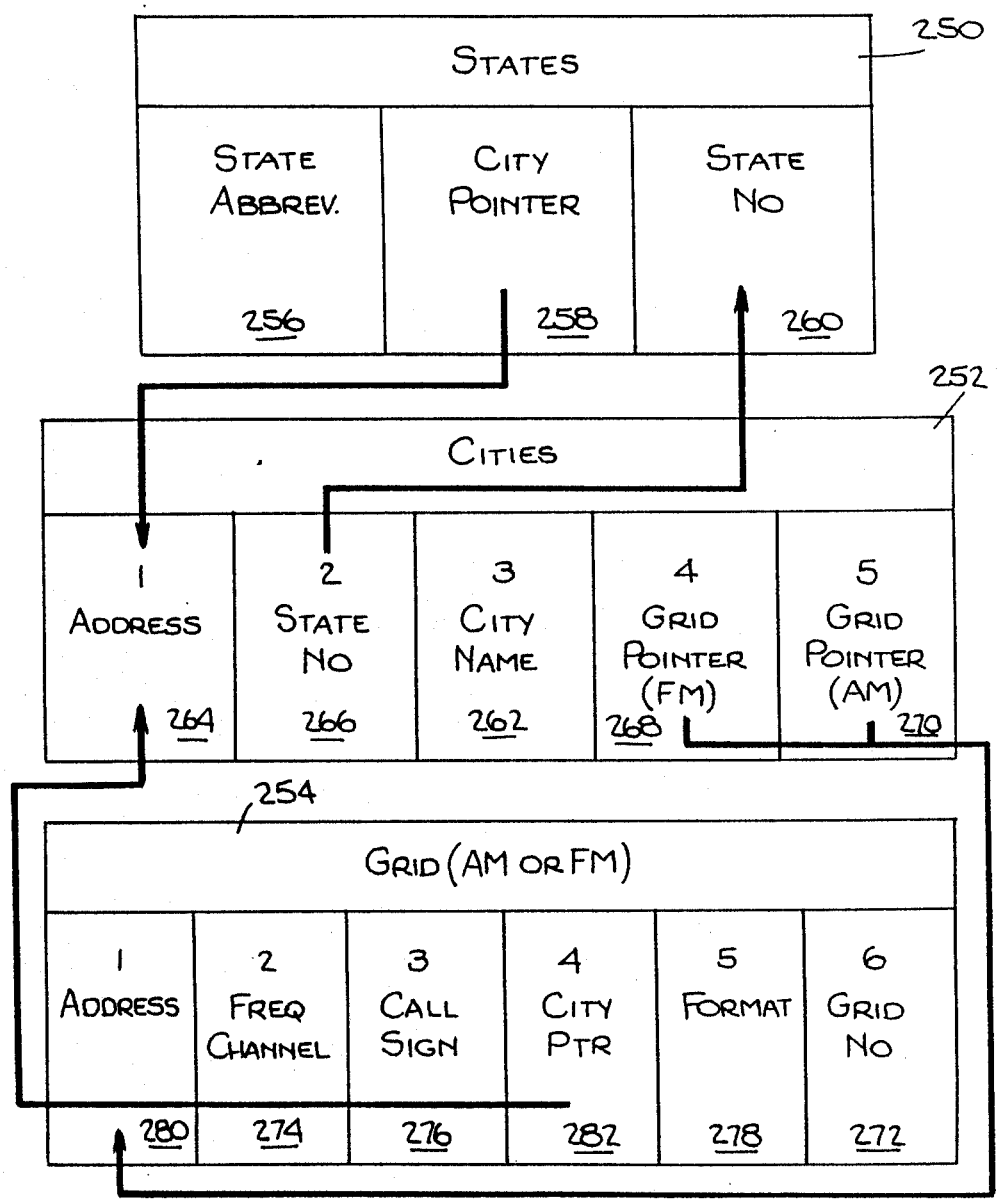
FIG. 6 is an example of a database organization for information stored in ROM relaxing to various attributes of available broadcast stations particularly useful for format scan.

In order to explain the format select/scan improvement, reference is now made to FIG. 6 which shows a typical database organization which may be used with the invention. It will be readily appreciated by those skilled in the art that the invention disclosed herein is not limited to a particular type of database organization, the only requirement being that the display information for each available station be accessible by the control module 1 and slave module 2 as a function of geographic location as fully explained hereinbefore.

Accordingly, in the example shown in FIG. 6, the database is partitioned according to the three basic identifying criteria: (1) a STATES file 250; (2) a CITIES file 252; and (3) a broadcast band frequency file 254 based on geographical groupings called GRIDS. Though only one GRID is shown in FIG. 6, there may actually be separate grids for AM, FM, shortwave and so on.

Once a user has entered the city and state data for the location of the receiver, the control module 1 immediately can determine the available stations within the broadcast region. Accordingly, the STATES file 250 contains three data fields: (1) the "abbreviation" field 256 contains one two-letter record for each state covered in the database; (2) the "city pointer" field 258 contains a unique address for each state record that identifies the first city record for that state in the CITIES file 252; and (3) the "state number" field 260 which simply assigns an identification number to each state to permit cross-referencing between files as will be explained.

The CITIES file 252 contains four data fields: (1) a "city name" field 262 that contains an alphabetized record entry for each city covered in the database organized by state; (2) a "state number" field 266 that identifies the state each city is in; and (3) one or more grid pointers 268,270 that identify for each city a unique address in the GRID file 254 for the first broadcast station in the corresponding geographic region where the receiver is located. Each record (consisting of the data in the four fields) is located at a unique address 264 in the CITIES file that indicates the position of the record in the file wherein the address of the first city for each state grouping (field 266) is the same as the corresponding city pointer 258 located in the STATES file 250.

The GRID file 254 contains all the available station entries covered in the database organized by geographic regions with each region assigned a unique GRID number stored in the "grid number" field 272. The GRID file 254 also contains the attribute data for each station such as the "frequency" field 274, the "call letter" field 276, and the "format" field 278. Each station of course has a unique address 280 wherein the address 280 for the first station in each GRID region grouping (field 272) is the same as the corresponding GRID pointer located in the CITIES file.

As an example, suppose the user is located in Cleveland, Ohio. The user would first set the state by pressing the STATE switch 204 and by repeatedly pressing the up/down switches 206,208 until the proper abbreviation "OH" would appear in the display. This combination of key strokes would make the control module 1 retrieve, in order, the state abbreviations located in field 256 of the STATES file 250, until the user presses the ENTER key 210. At that point the control module 1 stores the state number 260 in memory.

The user would then set the city by pressing the CITY switch 202 and by repeatedly pressing the up/down switches 206,208 until the proper city name "Cleveland" would appear in the display. This combination of key strokes would make the control module 1 retrieve the city names stored in alphabetical order and located in field 262 of the CITIES file 252, starting at the record pointed to by the city pointer 258 in the state file 250 which corresponds to the state number 260 previously stored in memory, this record corresponding to the first city in the state of Ohio, until the user presses the ENTER key 210. At that point the control module 1 stores in memory the GRID pointers 268 and 270 for future use. The GRID pointer identifies to the control module 1 the first broadcast station in the geographic region that includes Cleveland, Ohio. The GRID file then is entered to locate by frequency match the station currently being received. Once a frequency match is made in the GRID file, all the other attribute data is immediately accessed from the corresponding records in the pertinent fields.

Whenever the receiver is tuned to a particular station and the control module 1 program is in the GRID file 254, the city pointer in field 282 provides an immediate cross-reference back to the CITIES file 252 so that the control module knows the city for the received station. Once back in the CITIES file the "state number" field 266 provides an immediate cross-reference back to the STATES file. This cross-reference between files is useful when the geographic grids include several cities so that even if the user initially programmed his location as Cleveland, if he is tuned to an Akron station the display 8' will convey "Akron, Ohio."

Figure 7:
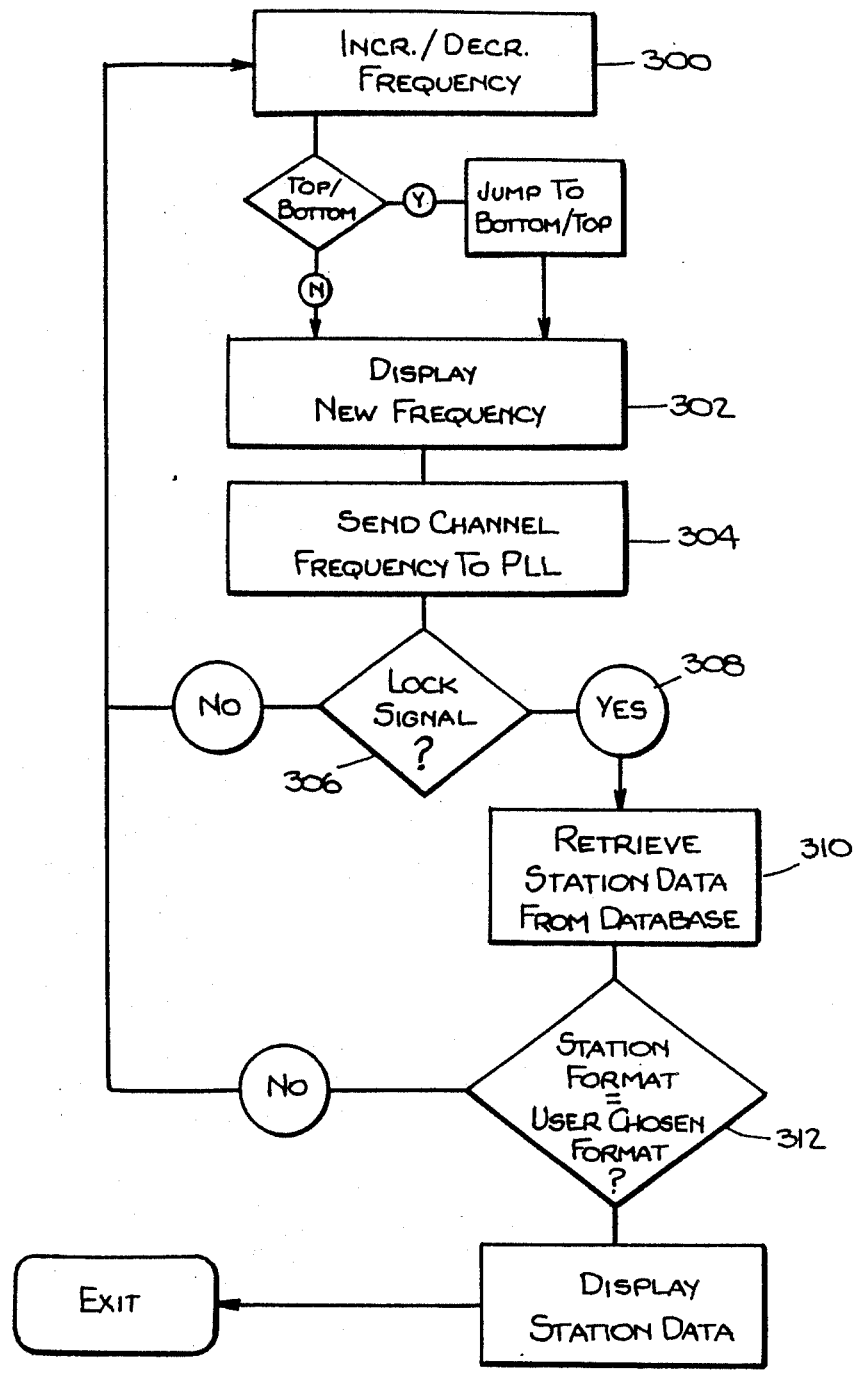
FIG. 7 is a flow diagram for a program that scans a database stored in the receiver of FIG. 5 to permit selective reception of available stations based on user preferred attributes such as station format.

With reference to FIG. 7, a format scan in accordance with the present invention is accomplished by first selecting a format. This is done by the user pressing one of the format keys 200. This initiates a frequency-scan at step 300 where the control module I increases the frequency, displays that frequency on display 8' at step 302, and sends that frequency to the PLL 5 at step 304.

At step 306 the control module checks whether a broadcast signal at the desired frequency has been received. If not, the receiver steps to the next frequency by looping back to step 300 as indicated.

Once a station has been locked into, as at step 308, the control module 1 at step 310 accesses the corresponding station information stored in ROM 3 based on the grid (geographic region) pointers, previously stored in memory during the state/city selection by the user.

Up to this point, operation of the receiver is substantially the same as fully explained hereinbefore. Whereas in my earlier embodiment, the receiver would next display the station attributes stored in memory, in this embodiment at step 312 the program checks whether the station format is the same as that selected by the user via switches 200. If yes the control module 1 displays the station information on display 8' as previously explained herein.

If, however, the received station format is not the same as that selected by the user, the control module 1 program loops back to step 300 and begins searching for the next available frequency.

Figure 8:
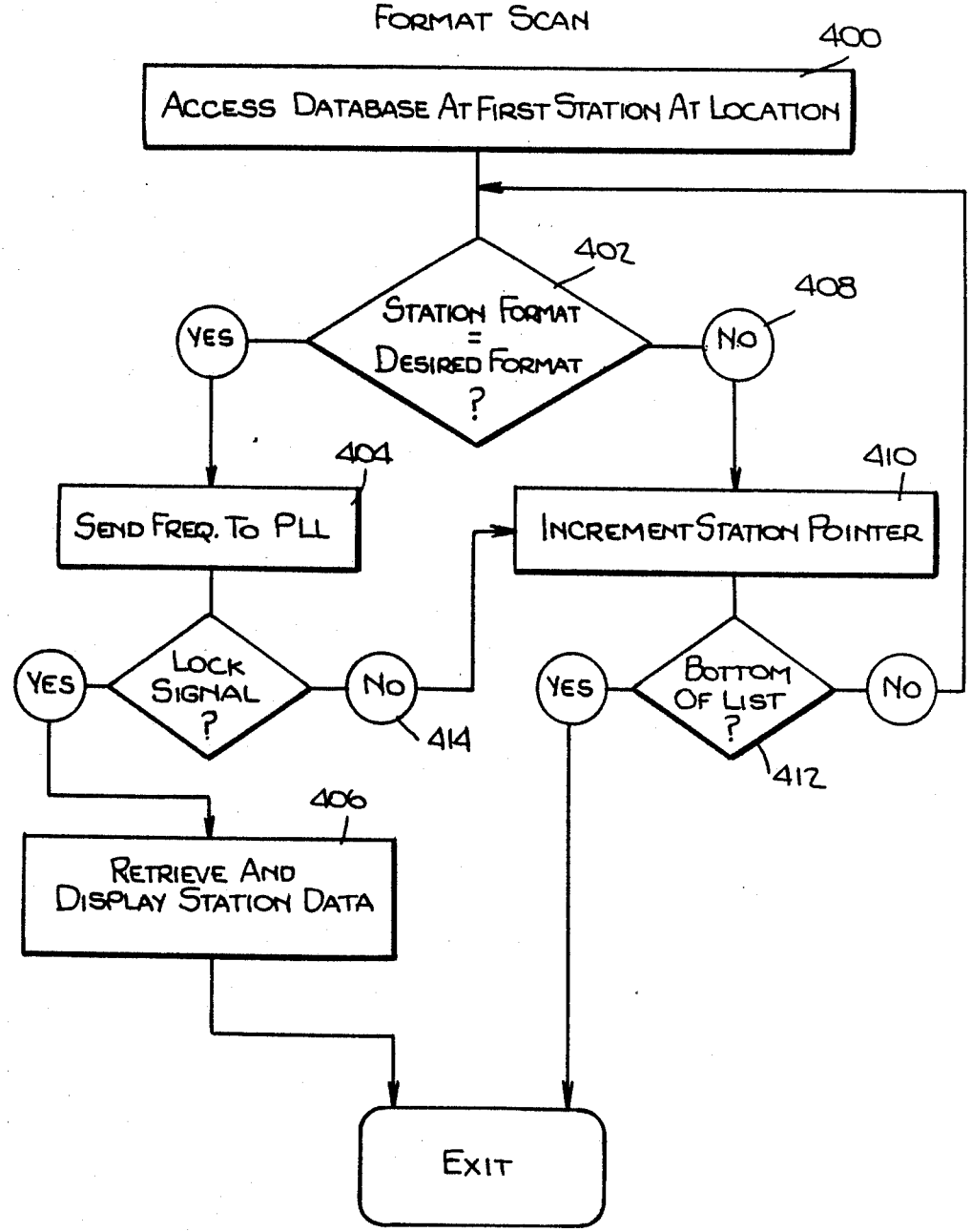
FIG. 8 is a flow diagram for an alternative program that scans the database prior to frequency selection.

With reference to FIG. 8, in an alternative embodiment of the format select or scan feature, after the user has entered a desired listening format by pressing the appropriate format switch 200, the control module 1 program first accesses the database stored in ROM 3. The program goes to the first station record located in the GRID file 254 corresponding to the GRID pointer previously stored in memory based on the city/state data. It will be recalled from the explanation of FIG. 6 that the available stations are organized by geographic location in the GRID file 254.

For example, suppose the user is in Cleveland, Ohio and desires an FM country and western station. The control module 1 accesses the first potentially available station data record that is in the geographic portion of the FM database that includes Cleveland.

At step 402 the program checks whether the format of the first potential station is the desired format. If yes, the receiver tunes to the corresponding frequency (step 404) and if the signal is received, then displays the station information on display 8' and permits reception (step 406).

If the format of the first station is not the desired format (step 408), or even if it is the desired format but the station cannot be received (step 414), the program jumps to the next station in the database for the geographic region (step 410) and loops back to step 402 to determine if the station is available and the correct format. Step 412 shows that the program checks whether all potential stations in the geographic region have been scanned for format and availability. If all have been scanned and no stations are available the receiver simply tunes to the first available station, or can be programmed to scan adjoining geographic regions.

In the event that there are several stations available in the geographic region that have the desired format, if the user wants to try a different station having the selected format he can simply activate he appropriate format key again and the receiver will advance to the next available station having that format. If none is available, the receiver simply remains tuned at the current station.

It is possible that two or more stations may broadcast on the same frequency within the same general area, even having the same program format. Each time a station signal is received, the control module 1 program scans the database in ROM 3 based on the city/state and frequency data (and if selected, format data) to determine all possible stations on that frequency within the listening area. Since the display 8' can only show one station at a time, the control module program alerts the user by sounding a buzzer (not shown) twice and permitting the user to alternately view the station data for each station on the tuned frequency by pressing the ENTER key 210.

Each time the ENTER key is pressed the control module 1 displays the data for the next station on the same frequency within the general listening area. By repeatedly activating the ENTER key the user can cycle through all the possible candidates for the station actually being heard. This feature is particularly useful in shortwave radio applications.

Various modifications of the invention can be made while staying within its scope as defined in the claim set out below.

What is claimed is:

1. A broadcast receiver system, comprising:
   a receiver for receiving a plurality of frequencies broadcast for reception in a plurality of geographic locations, the broadcast on each frequency being in one of a plurality of different program formats;
   tuning means for tuning said receiver to one of the plurality of broadcast frequencies for reception thereof;
   memory means for storing a database of information related to the plurality of broadcast frequencies in a number of files, including a first file storing information relating to geographic broadcast and reception locations and a second filed storing identification information relating to the frequencies broadcast for reception in each geographic reception location and the program format of each such frequency;

input means operable by a user for inputting the geographic reception location in which said receiver system is located and the one of the plurality of program formats that the user desires to be receive;

control means responsive to said input means for retrieving from said first file geographic broadcast location information corresponding to the input geographic reception location and, with said geographic broadcast location information, for accessing a first broadcast frequency in said second file that is broadcast for reception in the input geographic reception location and in the input desired program format;

scan initiating means selectively operable by the user for causing said control means to access only those broadcast frequencies stored in said second file following the first broadcast frequency, and broadcast for reception in the input geographic reception location and in the input desired program format;

means for causing said tuning means to tune said receiver to a selected one of the accessed broadcast frequencies; and display means for visually displaying the geographic broadcast location information, identification information, and program format of the selected one of the accessed broadcast frequencies.

2. The broadcast receiver system according to claim 1, wherein said first file of said memory means is organized to store the information relating to the geographic broadcast and reception locations in accordance with a plurality of geographic grids within a general broadcast region.

3. The broadcast receiver system according to claim 2, wherein said input means is operable to input the geographic reception location in which said system is located as one of the geographic grids and encompassing at least two geographic broadcast locations within said grid.

4. The broadcast receiver system according to claim 1, wherein said first file of said memory means is organized as a first subfile for storing state information and a second subfile for storing city information.

5. The broadcast receiver system according to claim 4, wherein said first subfile stores a plurality state data and a city pointer associated with each of said state data, wherein said second subfile stores a plurality of city data each associated with one state datum, a first of said city data associated with one state datum being addressed by said city pointer also associated with said one state datum.

6. The broadcast receiver system according to claim 5, wherein said second subfile stores a plurality of grid pointers each associated with one said city datum, wherein said second file stores a plurality of broadcast frequency data associated with one broadcast frequency, and a program format datum associated with each broadcast frequency, a first of said broadcast frequency data associated with one city datum being addressed by said grid pointer associated with said one city datum.

7. The broadcast receiver system according to claim 1, wherein each said broadcast frequency represents a broadcast station and at least two such stations having the same frequency may be received by said receiver at one geographic reception location, said system further comprising means for alternately selecting one of the two stations and thereby alternately causing said display means visually to display the geographic broadcast location information, identification information, and program format of the two stations.

8. The broadcast receiver system according to claim 1, wherein said control means comprises a programmed microprocessor, wherein said causing means is included in said programmed microprocessor and causes said tuning means to tune said receiver to a selected one of the accessed broadcast frequencies if it possesses sufficient signal strength to achieve acceptable reception.

9. The broadcast receiver system according to claim 1, wherein said second file of said memory means stores the call sign of each of said broadcast frequencies as said identification information.

10. The broadcast receiver system according to claim 1, wherein said second file of said memory means stores the numerical representation of each said broadcast frequency as said identification information.

* * * * *